(12) United States Patent
Imai

(10) Patent No.: US 9,923,458 B2
(45) Date of Patent: Mar. 20, 2018

(54) BOOSTER CIRCUIT INCLUDING A BOOSTER SECTION CONFIGURED TO OPERATE INTERMITTENTLY

(71) Applicant: SII Semiconductor Corporation, Chiba-shi, Chiba (JP)

(72) Inventor: Yasushi Imai, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/627,720

(22) Filed: Jun. 20, 2017

(65) Prior Publication Data

US 2017/0373591 A1 Dec. 28, 2017

(30) Foreign Application Priority Data

Jun. 28, 2016 (JP) .................................. 2016-127622

(51) Int. Cl.

| | |
|---|---|
| G05F 1/00 | (2006.01) |
| G05F 1/565 | (2006.01) |
| H02M 3/07 | (2006.01) |
| G11C 5/14 | (2006.01) |
| H03K 5/02 | (2006.01) |
| H02M 3/155 | (2006.01) |
| G11C 16/30 | (2006.01) |

(52) U.S. Cl.
CPC .............. H02M 3/07 (2013.01); G11C 5/145 (2013.01); G11C 16/30 (2013.01); H02M 3/155 (2013.01); H03K 5/023 (2013.01)

(58) Field of Classification Search
CPC .......... G05F 1/562; G05F 1/565; H02M 3/156
USPC .................... 323/266, 274, 275, 284, 285
See application file for complete search history.

(56) References Cited

U.S. PATENT DOCUMENTS

| | | | | |
|---|---|---|---|---|
| 5,619,124 A | * | 4/1997 | Lim ........................ | G05F 3/242 323/313 |
| 7,312,972 B2 | * | 12/2007 | Hourai ................... | H02M 3/155 323/265 |
| 2006/0279268 A1 | * | 12/2006 | Yu .......................... | H02M 3/156 323/282 |
| 2007/0279018 A1 | * | 12/2007 | Sumitomo ............ | H02M 3/156 323/224 |
| 2010/0123512 A1 | * | 5/2010 | Imai ....................... | G11C 5/145 327/530 |
| 2014/0111271 A1 | * | 4/2014 | Fujisawa ............... | G11C 5/145 327/536 |

* cited by examiner

*Primary Examiner* — Gary Nash
(74) *Attorney, Agent, or Firm* — Brinks Gilson & Lione

(57) ABSTRACT

Provided is a booster circuit enabling improvement of efficiency of a stress test for a circuit to which a boosted voltage is applied. A voltage divider circuit is configured to have a voltage-dividing ratio that is variable depending on a test signal, and a limiter circuit is configured to clamp a voltage to a voltage higher than a boosted voltage in normal operation. In a test mode, the voltage divider circuit is controlled so that the boosted voltage becomes higher than that in the normal operation, and the limiter circuit clamps the boosted voltage, with the result that a booster section continuously operates.

2 Claims, 2 Drawing Sheets

BOOSTER CIRCUIT INCLUDING A BOOSTER SECTION CONFIGURED TO OPERATE INTERMITTENTLY

RELATED APPLICATIONS

This application claims priority under 35 U.S.C. § 119 to Japanese Patent Application No. 2016-127622 filed on Jun. 28, 2016, the entire content of which is hereby incorporated by reference.

BACKGROUND OF THE INVENTION

1. Field of the Invention

The present invention relates to a booster circuit, and more particularly, to a booster circuit including a booster section configured to operate intermittently, which is used in testing a circuit to which a boosted voltage is applied.

2. Description of the Related Art

In non-volatile memories including EEPROMs capable of electrically erasing, writing, and reading data, it is necessary to apply a high voltage equal to or higher than a power supply voltage to a selected memory cell during the erase/write operation. Thus, the non-volatile memory incorporates a booster circuit to generate a desired high voltage.

FIG. 2 is a circuit diagram for illustrating a related-art booster circuit 20 used in a non-volatile memory. The related-art booster circuit 20 includes a PMOS transistor 21, a voltage divider circuit 22, a comparator circuit 23, an oscillator circuit 24, and a booster section 25. The booster section 25 is configured to boost a power supply voltage VCC based on a pulse signal output from the oscillator circuit 24, thereby outputting a boosted voltage VPP. The voltage divider circuit 22 is configured to divide the boosted voltage VPP, thereby outputting a divided voltage VFB. The comparator circuit 23 is configured to compare a reference voltage VREF and the divided voltage VFB to each other, thereby outputting the comparison result as a signal. When the divided voltage VFB is higher than the reference voltage VREF, the comparator circuit 23 outputs a signal at a low level to turn off the oscillator circuit 24, and hence the booster section 25 stops. On the other hand, when the divided voltage VFB is lower than the reference voltage VREF, the comparator circuit 23 outputs a signal at a high level to turn on the oscillator circuit 24, and hence the booster section 25 operates.

The booster circuit 20 is configured to output the desired boosted voltage VPP from its output terminal by repeating the operation described above (for example, see Japanese Patent Application Laid-open No. 2010-124590).

When the boosted voltage VPP is low, for example, at a time of activation, the PMOS transistor 21 is turned off so that the divided voltage VFB is a ground voltage VSS, that is, so that the booster section 25 operates. Further, the operation of the oscillator circuit 24 and the booster section 25 is controlled based on a signal EN from an enable terminal.

SUMMARY OF THE INVENTION

The present invention has an object to provide a booster circuit with improved efficiency of a stress test for a circuit to which a boosted voltage is applied.

According to one embodiment of the present invention, there is provided a booster circuit configured to boost an input voltage, thereby outputting a boosted voltage, the booster circuit including: an oscillator circuit configured to operate intermittently based on a signal input to the oscillator circuit; a booster section configured to boost the input voltage when the booster section receives a pulse signal from the oscillator circuit; a voltage divider circuit configured to divide the boosted voltage, thereby outputting a divided voltage; a comparator circuit configured to compare the divided voltage and a reference voltage to each other, thereby outputting a result of the comparison as the signal; a limiter circuit configured to clamp the boosted voltage; and a test terminal to which a test signal is to be input, the voltage divider circuit having a voltage-dividing ratio that is variable depending on the test signal, the signal output from the comparator circuit causing the booster section to continuously operate when the test signal indicates a test mode.

According to the booster circuit of the present invention, the voltage-dividing ratio of the voltage divider circuit is variable, and the limiter circuit is provided at the output terminal, with the result that the booster section can continuously operate in the test mode. It is therefore possible to improve the efficiency of the stress test for the circuit to which the boosted voltage is applied.

DETAILED DESCRIPTION OF THE PREFERRED EMBODIMENTS

Now, an embodiment of the present invention is described with reference to the drawings.

Figure 1:
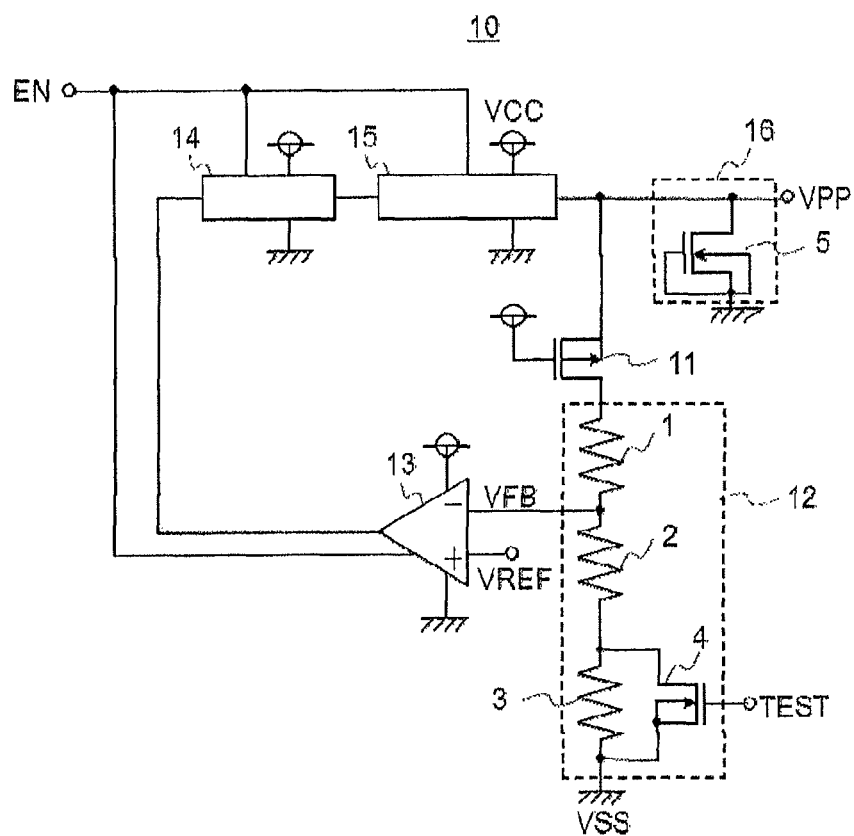
FIG. 1 is a circuit diagram for illustrating a booster circuit according to an embodiment of the present invention.
Figure 2:
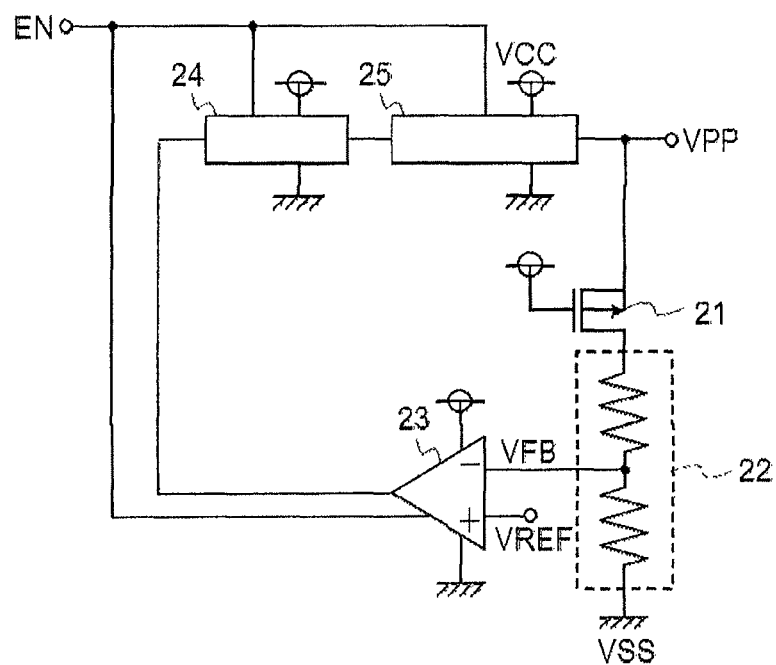
FIG. 2 is a circuit diagram for illustrating a related-art booster circuit.

FIG. 1 is a circuit diagram for illustrating a booster circuit 10 according to an embodiment of the present invention.

The booster circuit 10 of this embodiment includes a PMOS transistor 11, a voltage divider circuit 12, a comparator circuit 13, an oscillator circuit 14, a booster section 15, and a limiter circuit 16. The voltage divider circuit 12 includes resistors 1 to 3 connected in series, and an NMOS transistor 4 having a source and a drain connected to respective ends of the resistor 3, and a gate connected to a test terminal. To the test terminal, a signal TEST being a test signal is input. The limiter circuit 16 includes an NMOS transistor 5 having a source and a gate connected to a ground terminal.

The oscillator circuit 14 has a control terminal connected to an enable terminal, and an output terminal connected to an input terminal of the booster section 15. The booster section 15 has a control terminal connected to the enable terminal, and an output terminal connected to a boosted voltage output terminal. The PMOS transistor 11 has a source connected to the output terminal of the booster section 15, a drain connected to the voltage divider circuit 12, and a gate to which a power supply voltage VCC is input. The voltage divider circuit 12 is connected between the drain of the PMOS transistor 11 and the ground terminal. A node between the resistor 1 and the resistor 2 is connected to an inverting input terminal of the comparator circuit 13. The comparator circuit 13 has a control terminal connected to the enable terminal, a non-inverting input terminal to which a reference voltage VREF is input, and an output terminal connected to an input terminal of the oscillator circuit 14.

The oscillator circuit 14 is, for example, a ring oscillator circuit, and the oscillation operation of the oscillator circuit 14 is controlled based on an output signal from the comparator circuit 13. The booster section 15 is, for example, a charge pump circuit, and is configured to boost the power supply voltage VCC to a boosted voltage VPP based on a pulse signal output from the oscillator circuit 14, thereby outputting the boosted voltage VPP. The voltage divider circuit 12 is configured to divide the boosted voltage VPP, thereby outputting a divided voltage VFB. The comparator circuit 13 is configured to compare the divided voltage VFB and the reference voltage VREF to each other. The comparator circuit 13' is configured to output an output signal at a high level when the divided voltage VFB is lower than the reference voltage VREF, and output an output signal at a low level when the divided voltage VFB is higher than the reference voltage VREF. The limiter circuit 16 is configured to clamp a voltage at the boosted voltage output terminal to a voltage higher than the desired boosted voltage VPP.

Next, the operation of the booster circuit 10 having the above-mentioned configuration is described.

In normal operation, the signal TEST at a low level is input to the test terminal, and the NMOS transistor 4 of the voltage divider circuit 12 is turned off. That is, the divided voltage VFB is a voltage obtained by dividing the boosted voltage VPP by the resistors 1, 2, and 3.

When a signal EN from the enable terminal becomes a high level, the comparator circuit 13, the oscillator circuit 14, and the booster section 15 start to operate. In an initial state, the PMOS transistor 11 is turned off because the boosted voltage VPP, that is, a voltage at the source is lower than a voltage obtained by adding the power supply voltage VCC and the absolute value of a threshold voltage of the PMOS transistor 11. Consequently, the divided voltage VFB from the voltage divider circuit 12 is a voltage near a voltage VSS at the ground terminal. Thus, the reference voltage VREF is higher than the divided voltage VFB, and hence the comparator circuit 13 outputs the output signal at the high level. The oscillator circuit 14 starts the oscillation operation when receiving the output signal at the high level from the comparator circuit 13. The booster section 15 starts boost operation when receiving a pulse signal from the oscillator circuit 14.

When the booster section 15 starts the boost operation, the boosted voltage VPP at the boosted voltage output terminal gradually increases. Then, the PMOS transistor 11 is turned on, with the result that the voltage divider circuit 12 is connected to the boosted voltage output terminal, and the divided voltage VFB becomes a voltage depending on the boosted voltage VPP.

When the boosted voltage VPP increases, and the divided voltage VFB exceeds the reference voltage VREF, the comparator circuit 13 outputs the output signal at the low level. When receiving the output signal at the low level from the comparator circuit 13, the oscillator circuit 14 stops the oscillation operation, and the booster section 15 thus stops the boost operation. When the booster section 15 stops the boost operation, the boosted voltage VPP at the boosted voltage output terminal gradually decreases. When the divided voltage VFB falls below the reference voltage VREF, the comparator circuit 13 outputs the output signal at the high level.

The booster circuit 10 supplies the desired boosted voltage VPP from the output terminal by repeating the operation described above. At this time, since the limiter circuit 16 is configured to clamp a voltage at the boosted voltage output terminal to a voltage higher than the desired boosted voltage VPP, the voltage at the boosted voltage output terminal is not affected.

In a test mode, the signal TEST at a high level is an input to the test terminal, and the NMOS transistor 4 of the voltage divider circuit 12 is turned on. That is, the divided voltage VFB is a voltage obtained by dividing the boosted voltage VPP by the resistor 1 and the resistor 2. Thus, the divided voltage VFB in this case is lower than that in the normal operation when the boosted voltage VPP is the same.

The comparator circuit 13, the oscillator circuit 14, and the booster section 15 start operations when the signal EN to the enable terminal becomes the high level.

In the test mode, since the NMOS transistor 4 is turned on, the booster section 15 tries to output, from the output terminal, a boosted voltage higher than that in the normal operation. However, due to a breakdown voltage of the NMOS transistor 5, the limiter circuit 16 clamps the boosted voltage to the test mode boosted voltage VPP which is higher than that in the normal operation. Since the divided voltage VFB in the test mode is always fixed to a voltage lower than the reference voltage VREF, the comparator circuit 13 continuously supplies the output signal at the high level to make the booster section 15 continuously operate.

As described above, in the test mode, the booster circuit 10 outputs the test mode boosted voltage VPP that is determined by the limiter circuit 16 and is higher than that in the normal operation, and the booster section 15 continuously operates. Thus, the booster circuit 10 enables improvement of efficiency of a stress test for a circuit portion, for example, a memory element, which is connected to the output terminal and to which the boosted voltage VPP is applied.

The embodiment of the present invention has been described above, but the booster circuit 10 of the present invention is not limited to the above-mentioned embodiment, and it is to be understood that various modifications can be made thereto without departing from the gist of the present invention.

For example, the limiter circuit 16, which uses the breakdown voltage of the NMOS transistor, may use a diode.

Further, the voltage divider circuit 12 is described as being configured so that the NMOS transistor 4 is turned on based on the signal TEST at the high level input to the test terminal. However, it is only necessary that the voltage-dividing ratio be variable, and the voltage divider circuit 12 is not limited to the circuit described above.

Further, the booster circuit 10 is described as being configured to boost the power supply voltage VCC. However, the booster circuit 10 may boost a voltage input thereto other than the power supply voltage VCC.

Further, the booster circuit 10 is described as being activated or stopped based on the signal EN from the enable terminal. However, the booster circuit 10 may not have the enable terminal.

What is claimed is:
1. A booster circuit configured to boost an input voltage, thereby outputting a boosted voltage, the booster circuit comprising:
   an oscillator circuit configured to operate intermittently based on a signal input to the oscillator circuit;
   a booster section configured to boost an input voltage to a boosted voltage when the booster section receives a pulse signal from the oscillator circuit;

a voltage divider circuit configured to divide the boosted voltage, thereby outputting a divided voltage;

a comparator circuit configured to compare the divided voltage and a reference voltage to each other, thereby outputting a result signal of the comparison as the signal;

a limiter circuit configured to clamp the boosted voltage; and a test terminal to which a test signal is input, the voltage divider circuit having a voltage-dividing ratio that is variable depending on the test signal, the result signal output from the comparator circuit causing the booster section to continuously operate when the test signal indicates a test mode, wherein the limiter circuit is configured to clamp the boosted voltage to a voltage higher than a boosted voltage in normal operation and lower than a boosted voltage in the test mode.

2. A booster circuit according to claim 1, wherein a voltage-dividing ratio of the voltage divider circuit is changed so that the divided voltage decreases when the test signal indicates the test mode.

* * * * *